United States Patent [19]
Hatano

[11] Patent Number: 5,954,887
[45] Date of Patent: Sep. 21, 1999

[54] CLEANING PROCESSING METHOD OF A FILM FORMING APPARATUS

[75] Inventor: Tatsuo Hatano, Yamanashi-ken, Japan

[73] Assignee: Tokyo Electron Limited, Tokyo, Japan

[21] Appl. No.: 09/098,987

[22] Filed: Jun. 17, 1998

[30] Foreign Application Priority Data

Jun. 21, 1997 [JP] Japan .................................. 9-180790

[51] Int. Cl.[6] .................. B08B 5/00; B05D 3/04
[52] U.S. Cl. .................. 134/2; 134/1.3; 134/19; 134/21; 134/22.1; 134/25.1; 134/25.4; 134/37; 216/67; 427/309; 427/534; 427/535; 427/576; 438/905
[58] Field of Search .................. 134/2, 1.3, 19, 134/21, 22.1, 22.18, 25.1, 25.4, 37; 427/534, 535, 309, 576; 438/905; 216/67

[56] References Cited

U.S. PATENT DOCUMENTS

| | | | |
|---|---|---|---|
| 5,508,066 | 4/1996 | Akahori | 427/571 |
| 5,514,425 | 5/1996 | Ito et al. | 427/534 |
| 5,695,831 | 12/1997 | Miyazaki | 427/576 |
| 5,709,757 | 1/1998 | Hatano et al. | 134/22.14 |
| 5,721,021 | 2/1998 | Tobe et al. | 427/570 |

Primary Examiner—Zeinab El-Arini
Attorney, Agent, or Firm—Oblon, Spivak, McClelland, Maier & Neustadt, P.C.

[57] ABSTRACT

Disclosed herein is a cleaning processing method in which an object to be processed is mounted on a susceptor in a process chamber of a CVD apparatus, a $TiCl_4$ gas, a $H_2$ gas, and a Ar gas are introduced, a Ti film is formed on a surface of the object to be processed in a region of a plasma generated, the object to be processed is conveyed out of the process chamber, supply of the $H_2$ gas and the Ar gas is thereafter stopped without generating a plasma, and the $TiCl_4$ gas is introduced by means of a carrier gas, to remove unnecessary Ti films sticking to the inside of the film forming apparatus.

14 Claims, 4 Drawing Sheets

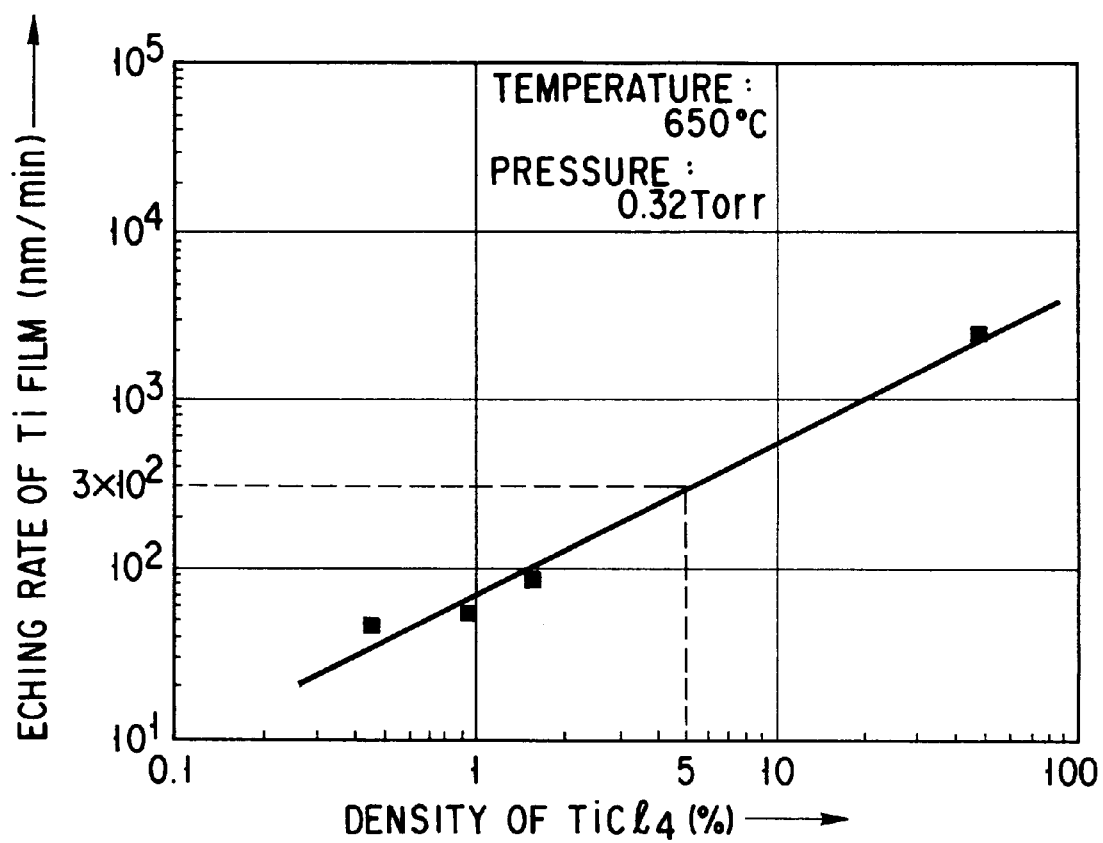
F I G. 4

CLEANING PROCESSING METHOD OF A FILM FORMING APPARATUS

BACKGROUND OF THE INVENTION

The present invention relates to a cleaning processing method of a film forming apparatus.

In general, a semiconductor integrated circuit comprised of a number of circuit elements is formed on a substrate such as a silicon substrate or the like by repeating film forming processing and pattern etching processing.

In manufacturing steps thereof, metal wires connecting circuit elements with each other, contact metals making electric contacts with circuit elements, and barrier metals for preventing diffusion of Si from the substrate all preferably have a low electric resistance and are also preferably made of materials having an excellent corrosion-resistance.

Ti (titanium), W (tungsten), Mo (molybdenum), and the like are selected as those materials. In particular, a Ti film has an excellent characteristic such as an electric characteristic, a corrosion-resistance, and the like and is therefore used in many cases.

For example, in case of forming a Ti film by a CVD method using a CVD (Chemical Vapor Deposition) apparatus, film formation is carried out by plasma processing in an atmosphere in which a $TiCl_4$ (titanium tetrachloride) gas and a $H_2$ gas are introduced as material gases.

Not only in film formation of a Ti film but also in film formation on a wafer surface by a CVD apparatus, an unnecessary film inevitably sticks to the side wall of a process chamber, surfaces of a susceptor (or mount table), a shower head which supplies a material gas, and the like.

If such an unnecessary film is peeled off during film formation on a semiconductor wafer, the peeled film becomes particles which stick to the semiconductor surface while film formation is being performed, thereby causing a factor of a defective element. Therefore, cleaning processing for removing a film formed on and sticking to inner structural components and the like is sequentially performed on a certain number of wafers, e.g., twenty five.

Generally, in the cleaning processing of an unnecessary Ti film, a semiconductor wafer on which a Ti film is formed is conveyed out of a process chamber. Thereafter, the temperature of the process chamber is decreased to about 200 to 300° C. which is preferred as a cleaning temperature, from about 650° C. which is a film forming temperature of a Ti film. After the temperature reaches the cleaning temperature, the $ClF_3$ gas, $NF_3$ gas, and the like are introduced to a processing chamber and cleaning processing is carried out.

In case of using a $ClF_3$ gas, electric discharging is stopped to prevent generation of a plasma (hereinafter called plasmaless cleaning processing). In case of using a $NF_3$ gas, a plasma is generated (hereinafter called plasma cleaning processing).

The temperature in the process chamber is decreased to 200 to 300° C. when carrying out cleaning processing as described above, because not only unnecessary Ti films but also inner walls of the process chamber and the surfaces of the susceptor are removed if the temperature in the process chamber is too high.

After the cleaning processing is thus completed in a predetermined time period, the temperature in the process chamber is increased again, for example, to 650° C., and formation of a Ti film is continued.

FIG. 6 shows the temperature in the process chamber in film forming steps according to a conventional CVD method.

In the film forming steps, the period Ti is a film forming processing step in which the temperature in the processing chamber is set to 650° C. which is the film forming temperature. In this step, for example, film formation of Ti films is performed sequentially on twenty five semiconductor wafers in an atmosphere in which material gases as described above are introduced.

Upon completion of the film formation, the processing flow goes to a cleaning processing step. At first, the temperature is decreased from 650° C. to 250° C. in a period T2. After the temperature reaches the cleaning temperature, a $ClF_3$ gas, a $NF_3$ gas, and the like are introduced into the process chamber in a period T3 and cleaning processing is performed on the Ti films.

Upon completion of the cleaning processing, the temperature in the process chamber is increased to 650° C., and the cleaning processing step is completed.

Further, the processing flow further goes again to a film forming processing step and Ti films are formed on a semiconductor wafer, like in the period Ti.

Thus, the film forming processing step (corresponding to the period Ti) and the cleaning processing step (corresponding to the periods T2 to T4) are repeatedly carried out.

In a conventional cleaning processing step as described above, the temperature of the chamber must be increased and decreased before and after the cleaning processing in the period T3, e.g., in the periods T2 and T4, as shown in FIG. 6. Therefore, film forming processing cannot be carried out during the periods T2 and T4, and as a result, a problem occurs in that the throughput is decreased.

Although depending on the number of wafers to be subjected to film forming processing, for example, each of the period T2 for decreasing the temperature and the period T4 for increasing the temperature requires about thirty minutes with respect to the period T3 of the cleaning processing of about thirty minutes, so that the time required for the cleaning processing step finally occupies ninety minutes, thereby causing a significant factor which decreases the throughput.

In addition, since the increase and decrease of the temperature are repeatedly carried between the film forming temperature and the cleaning temperature, there is a drawback that metal fatigue is accumulated in structural components inside a chamber, such as a mount table or the like, and the life-time of the structural components and the like are shortened.

Further, in plasma cleaning processing using a $NF_3$ gas, it is impossible to sufficiently remove films formed on and sticking to portion other than the region where a plasma is formed, e.g., films sticking to side surfaces of a shower head.

BRIEF SUMMARY OF THE INVENTION

The present invention has an object of providing a cleaning processing method for a film forming apparatus, in which an unnecessary portion of a Ti film sticking to the inside of the apparatus under a plasmaless atmosphere is removed with use of a $TiCl_4$ gas as a gas for forming a Ti film.

Hence, the present invention provides a cleaning processing method for a film forming apparatus, comprising steps of: mounting an object to be processed, on a susceptor in a process chamber of the film forming apparatus, forming a Ti film on a surface of the object to be processed in a plasma region generated in an atmosphere formed by introducing a TiCl$_4$ or other metal halide gas, a H$_2$ gas, and a Ar gas, and conveying the object to be processed, out of the process chamber; and thereafter stopping supply of the H$_2$ gas and the Ar gas while continuing supply of the TiCl$_4$ gas, and performing cleaning to remove an unnecessary potion of a Ti film sticking to the film forming apparatus under a plasma-less atmosphere.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing a relationship between the etching rate of a Ti film and the concentration of a TiCl$_4$ gas with respect to a N$_2$ gas.

DETAILED DESCRIPTION OF THE INVENTION

In the following, explanation will be specifically made of an embodiment according to the present invention.

Figure 1:
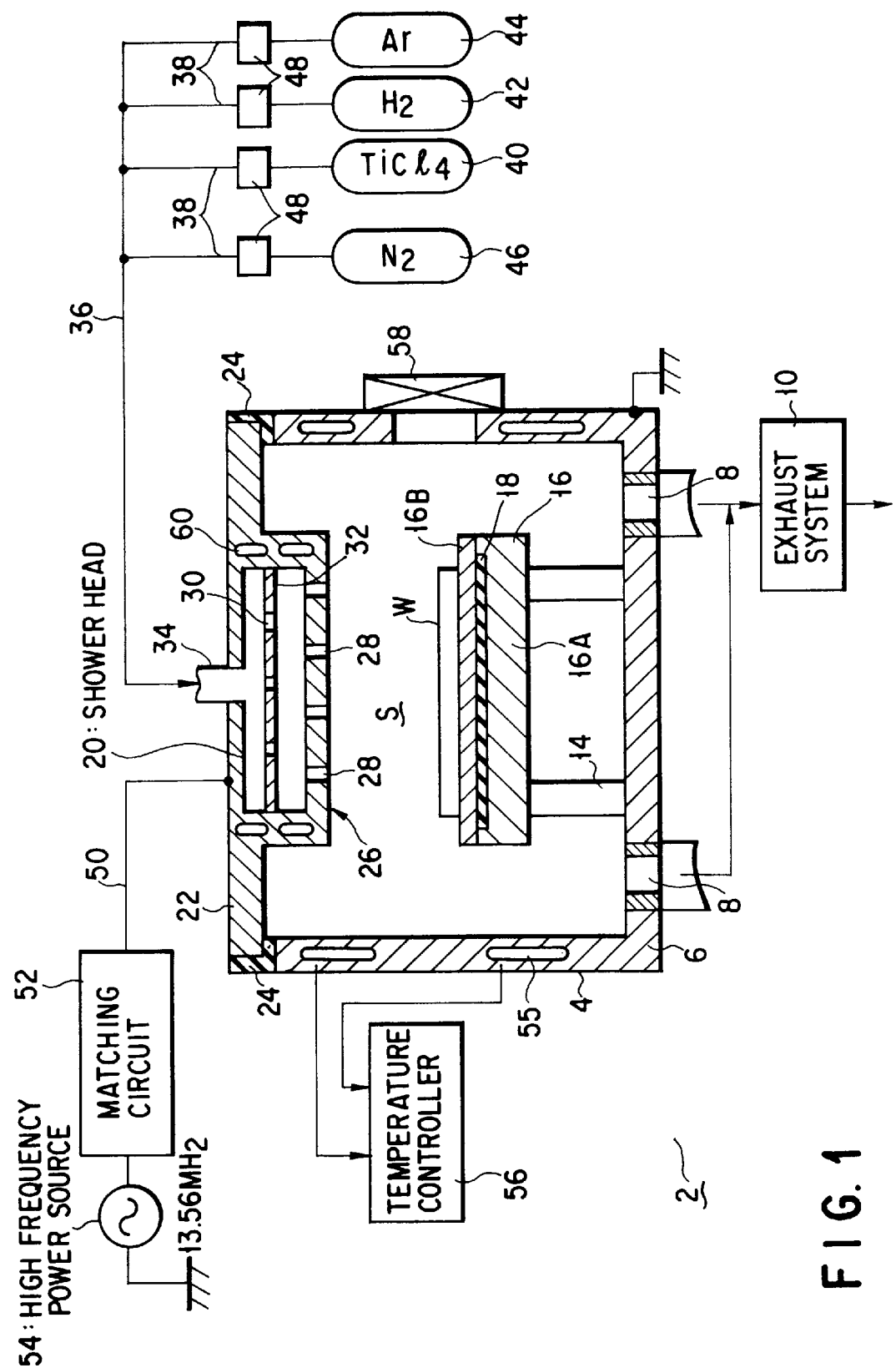
FIG. 1 is a view showing a film forming apparatus (or CVD apparatus) for practicing a cleaning processing method according to the present invention.

FIG. 1 shows an example of a structure of a film forming apparatus (or plasma CVD apparatus) and explains a cleaning processing method according to the present invention.

In the present embodiment, explanation will be made of a case of forming a Ti (titanium) film as a metal film.

The CVD apparatus 2 has a process chamber (or reaction chamber) 4 made of, for example, stainless steel or the like, and the potential of the process chamber 4 is grounded.

A plurality of exhaust ports 8 are provided at a bottom portion 6 of the process chamber 4. The exhaust ports 8 are connected with an exhaust system 10 including a vacuum pump and the like. The inside of the process chamber is uniformly evacuated or a process gas, a cleaning gas, and the like are exhausted uniformly therefrom.

A support columns 14 made of a conductive material are fixed to the bottom surface of the process chamber 4, and a susceptor 16 for mounting, for example, a semiconductor wafer W is supported by the support columns 14.

The susceptor 16 is at the same potential as the process chamber and also serves as a lower electrode in the CVD apparatus. The susceptor 16 consists of a lower base 16A directly supported on the support column 14 and an upper base 16B joined to the upper surface of the lower base 16A. The joining surfaces of the lower base 16A and the upper base 16B are joined to each other by welding.

The shower head 20 is provided so as to have a size enough to cover substantially the entire of the upper surface of the susceptor 16, such that the head 20 is opposed to the upper surface, forming a processing space S (or a plasma region) between the head and the susceptor 16. The shower head 20 serves to introduce various gases in form of shower to the processing space, and a number of injection holes 28 are formed in the injection surface 26 at the lower surface of the shower head 20.

In addition, a diffusion plate 32 having a number of diffusion holes 30 is provided at the inside of the shower head 20 so that a gas can be diffused therefrom.

A gas introduce port 34 for introducing a material gas and the like into the head is provided at an upper portion of the shower head 20, and the gas introduce port 34 is connected with a material gas supply line 36.

The gas supply line 36 is branched into a plurality of branch tubes 38 which are respectively connected to, for example, a TiCl$_4$ gas source 40 which stores a TiCl$_4$ gas, a H$_2$ gas source 42 which stores a H$_2$ gas, a Ar gas source 44 which stores a Ar gas as a plasma gas, and a N$_2$ gas source 46 which stores an inactive gas, e.g., a N$_2$ gas used as a carrier gas during cleaning.

The flow rates of the gases are respectively controlled by flow rate controllers, e.g., mass-flow controllers 48 provided for the branch tubes.

In the present embodiment, the gas supply line connected to the shower head 20 is shared by material gases used for film formation, through branch tubes 38. However, the present invention is not limited hitherto, but it is possible to adopt a gas supply form called a post mix type, in which gas tubes for several parts of gasses such as a carrier gas and a purge gas or in which gas tubes for all of the gases may be individually connected to the shower head 20 and the parts or all of the gases may be mixed in a processing space S.

In order to form a plasma during formation of a Ti film, the top plate 22 is connected with a matching circuit 52 and a high frequency power source 54 for forming a plasma of, for example, 13.56 MHz.

The side wall of the process chamber 4 is provided with a chamber temperature control jacket for selectively flowing a cooled medium upon necessity for temperature control of the wall surface. The jacket 55 is connected with a temperature controller 56.

The side wall of the process chamber 4 is also provided with a gate valve 58 which can be opened and closed when conveying in and out a semiconductor wafer W.

Further, the shower head 20 is provided with a head temperature control jacket 60 for selectively flowing a cooled medium upon necessity for temperature control of the surface including the injection surface 26.

Although not shown, it is needless to say that the susceptor 16 may be provided with a wafer lifter pin for lifting up and down a semiconductor wafer W when conveying in and out the semiconductor wafer W.

Explanation will now be made of a cleaning processing method according to the present invention which is carried out after a film forming processing step, using a CVD apparatus constructed as described above.

The cleaning processing method is carried out in a cleaning processing step for removing unnecessary Ti films sticking to the inside of the process chamber after a processing object on which a metal film has been formed in a film forming processing step is conveyed out. In practice, the film forming step and the cleaning processing step are alternately repeated.

Figure 2:
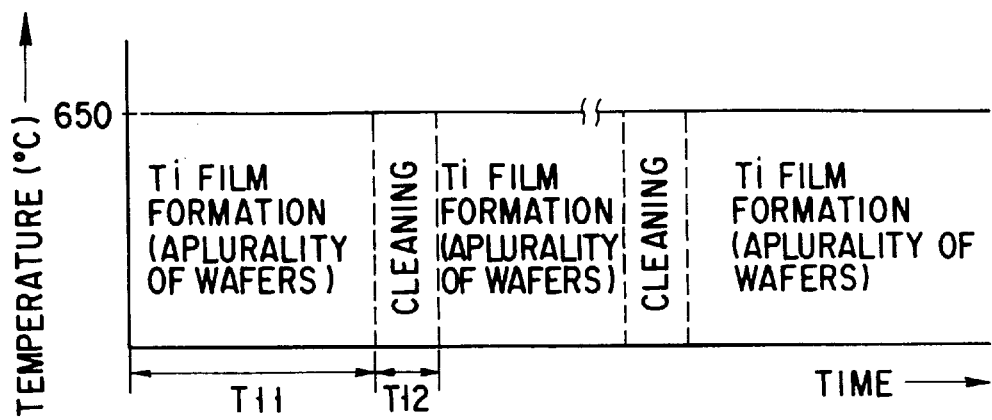
FIG. 2 is a view for explaining steps of a cleaning processing method according to an embodiment of the present invention.

FIG. 2 shows a cleaning processing step according to the present embodiment in the film formation using a CVD method, in which the longitudinal axis represents the temperature in the process chamber and the lateral axis represents the time.

At first, explanation will be made of a case in which a Ti film is formed on the surface of a semiconductor wafer W in the film forming processing step of a period T11.

A semiconductor wafer W is conveyed into the process chamber 4 through an opened gate valve 58 from the outside or a load lock chamber not shown. The semiconductor wafer W is mounted on a susceptor 16 and the gate valve is then closed. A contact hole and the like are formed in the surface of the semiconductor wafer W in a previous step, to make contact with electrodes of a circuit element on the wafer.

After the gate valve 58 is closed, evacuation is performed to a predetermined vacuum degree. Further, $TiCl_4$ gas and $H_2$ gas used as material gases and Ar gas for generating a plasma are introduced at predetermined flow rates controlled by the mass-flow controller 48, and the inside of the process chamber 4 is maintained at a predetermined pressure by a vacuum system 10.

At the same time, a high frequency wave of 13.56 MHz is applied between the shower head 20 as an upper electrode and the susceptor 16 as a lower electrode, from a high frequency power source 54.

The Ar gas is thereby changed into plasma. The plasma promotes the reduction of $TiCl_4$ gas with $H_2$ gas. As a result, a Ti film is formed on the surface of the semiconductor wafer W. While the Ti film is being formed, the temperature of the semiconductor wafer W is maintained at a prescribed value by a heater 18 embedded in the susceptor.

The side wall of the process chamber 4 and the shower head 20 which tend to be heated by a plasma are cooled to predetermined temperatures by respectively making cooling media flow through the chamber temperature control jacket 56 and the head temperature control jacket 60.

In this time, the process conditions are arranged, for example, such that the wafer temperature (or susceptor temperature) is about 650° C., the process pressure is about 1 Torr, and the high frequency power is about 700W.

Thus, upon completion of film forming processing for one semiconductor wafer W, the semiconductor wafer W thus processed is conveyed out through the gate valve 58 opened, and a next semiconductor wafer W not processed is conveyed into the process chamber 4. Film forming processing of a Ti film is performed on this wafer in the same manner as described above.

The film forming processing as described above is sequentially performed on a predetermined number of semiconductor wafers W, e.g., twelve to twenty five wafers W. In this while, unnecessary Ti films gradually stick to and are deposited on the internal structure of the process chamber 4 and the inner wall of the chamber.

Next comes a cleaning processing step according to the present embodiment, as indicated by a period T12 in FIG. 2.

After the last (for example twenty-fifth) semiconductor wafer W on which film forming processing is completed is conveyed out of the chamber, the gate valve 58 is closed and the inside of the process chamber 4 is subjected to evacuation by an exhaust system 10. In this time, the temperature in the chamber is maintained at the same temperature as that in the film forming processing step.

Thereafter, with the supply of the Ar gas and $H_2$ gas stopped, the $TiCl_4$ gas as a material gas and an inactive gas, e.g., an $N_2$ gas as a carrier gas which helps supply of the $TiCl_4$ gas are introduced into the chamber.

No high frequency wave is supplied from the high frequency power source, and cleaning processing is carried out under a plasmaless condition. Therefore, a mixture gas of only the $TiCl_4$ gas and the $N_2$ gas is supplied under a plasamaless condition.

The cleaning processing is carried out while the temperature of the susceptor 16, i.e., the temperature in the process chamber 4 is maintained at the same temperature as that when forming a Ti film during the period T11, e.g., 650° C.

Therefore, etching of unnecessary Ti films is performed, i.e., cleaning processing is performed without decreasing the temperature in the process chamber.

Process conditions of the cleaning processing are preferably arranged such that the pressure is about 0.1 to 10 Torr and the flow ratio of the $TiCl_4$ gas to the $N_2$ gas is about 5 to 100%, in order to obtain an etching rate of unnecessary Ti films.

The etching processing is performed for a predetermined period T12 and the cleaning processing step is thereby completed. Then, introduction of the $TiCl_4$ gas and the $N_2$ gas is stopped and evacuation is once carried out by an exhaust system.

Further, a next lot of semiconductor wafers W are conveyed into the process chamber 4, and the processing flow goes to the film forming processing step of forming a Ti film again like in the period T11.

At the time point when the film forming processing step is thus started again, operation for increasing the temperature needs not be carried out but the film forming processing step can be immediately started since the temperature in the process chamber 4 and the temperature of the susceptor 16 are maintained at 650° C. in the cleaning processing step, which is the same as that used when forming a film.

In this manner, the film forming step of forming a Ti film and the cleaning step thereof are carried out alternately and sequentially, as shown in FIG. 2.

Figure 6:
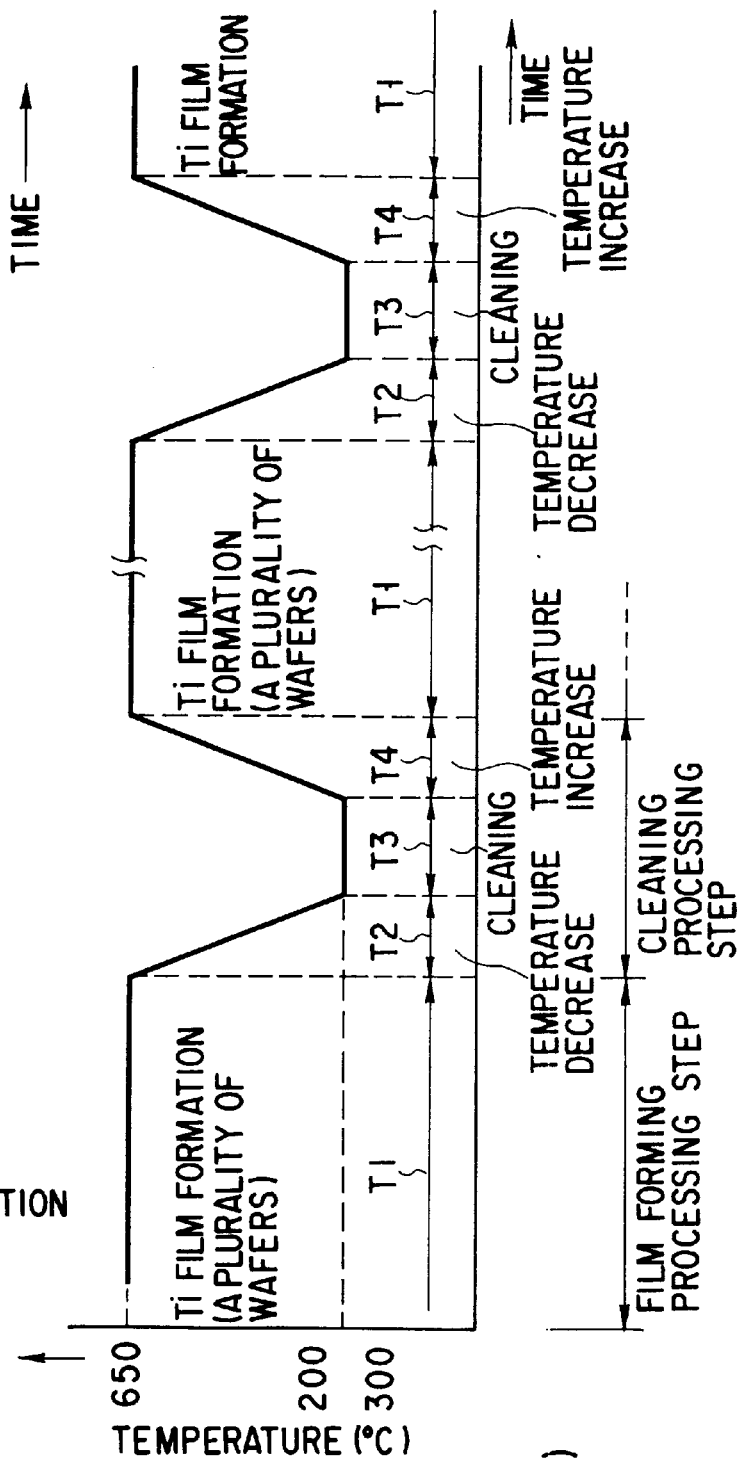
FIG. 6 is a diagram illustrating a conventional etching method.

Therefore, as is apparent from the present embodiment shown in FIG. 2 and the film forming step including the conventional cleaning processing step shown in FIG. 6, it is not necessary to perform operation of increasing or decreasing the temperature of the susceptor 16 when the processing flow goes to the cleaning processing step from the film forming processing step or when the processing flow returns inversely again to the film forming processing step from the cleaning processing step, in the present embodiment.

Thus, according to the present embodiment, it is possible to save the time required for operation for decreasing or increasing the temperature, which is necessary for a conventional method, and the throughput can be improved accordingly.

Next explanation will be specifically made of etching operation for unnecessary Ti films with use of a $TiCl_4$ gas in the cleaning processing method according to the present invention.

Figure 3:
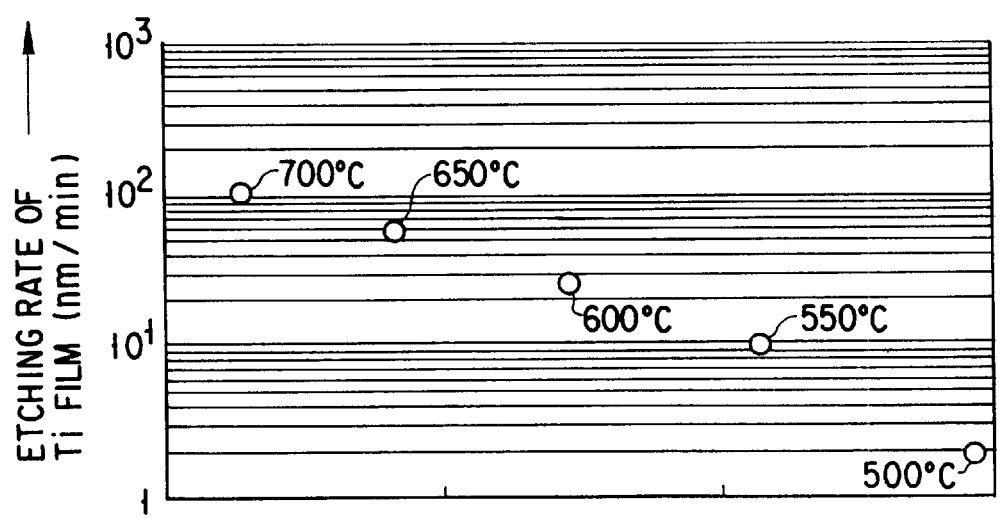
FIG. 3 is a view showing changes of an etching rate with respect to the temperature in a chamber (or susceptor) and a Ti film.

FIG. 3 shows data concerning changes of the temperature and the etching rate with respect to a Ti film when a Ti film was actually etched. The etching conditions were arranged such that the pressure is 0.32 Torr, the flow ratio of a $TiCl_4$ gas to a $N_2$ gas is 20 cc:650 cc, and the $TiCl_4$ gas has a concentration of about 3%.

As a result of etching a Ti film with the temperature variously changed from 500° C. to 700° C., it has been found that the higher the temperature is, the greater the etching rate of the Ti film is.

When the temperature was 650° C. which is the same as that in the step of forming a Ti film exemplified in the present embodiment, an etching rate of approximately 60 nm/min was obtained.

In this cleaning processing method, inner walls of the process chamber 4 and surfaces of the susceptor 16 are not substantially removed at all but maintain original conditions without damages.

FIG. 4 shows a relationship between the concentration of a $TiCl_4$ gas with respect to a $N_2$ gas as a carrier gas and the etching rate. Etching conditions in this relationship are arranged such that the temperature in the process chamber is 650° C. and the pressure is 0.32 Torr.

From the relationship, it has been found that the etching rate of a Ti film increases in accordance with an increase of the concentration of the $TiCl_4$ gas.

Generally, in a conventional cleaning processing step using a $ClF_3$ gas and a $NF_3$ gas, the etching rate is approximately 300 nm/min. Hence, it has been found that the concentration of the $TiCl_4$ gas in the present embodiment should be set to about 5% in order to obtain an etching rate substantially equal to the etching rate of the conventional cleaning processing step. Note that the concentration of a $TiCl_4$ gas during actual cleaning should appropriately be changed in accordance with a desired etching rate and the processing pressure is not limited to 0.32 Torr which is only an example.

Thus, according to the present invention, a $TiCl_4$ gas is used as a cleaning gas under a plasmaless condition when cleaning Ti films, and therefore, it is possible to remove unnecessary Ti films at a high temperature equal to the film forming temperature of the Ti films.

As a result, it is possible to omit operation of decreasing and increasing the temperature of the susceptor, which is performed in a conventional cleaning processing step, and accordingly, the throughput can be improved. Also, the necessity to decrease or increase the temperature in the process chamber is lost accordingly. Therefore, the frequency at which a heat cycle causes metal fatigue in a structure in a chamber, and accordingly, the life-time of the structure in the chamber can be elongated.

Further, since cleaning processing can be performed without generating a plasma, unnecessary Ti films sticking to other portions than the surfaces facing a plasma region can be removed.

In addition, since the gas used for forming films can be used for cleaning processing, it is unnecessary to provide an optional equipment such as a gas supply system specialized for cleaning, unlike in a conventional method.

Figure 5:
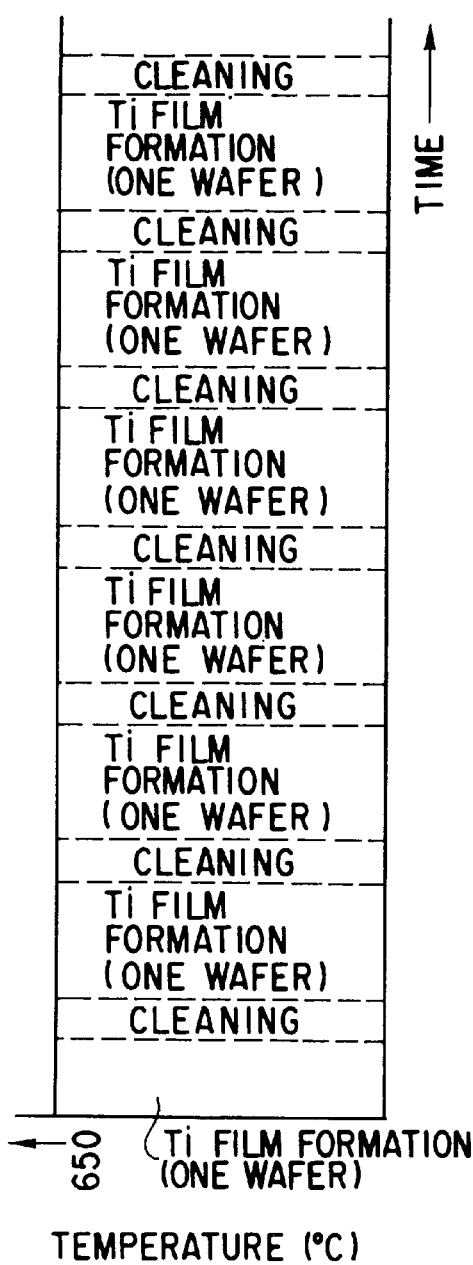
FIG. 5 is a view showing a modification of a processing method according to the present invention.

Although the present embodiment performs cleaning processing once after every sequential film formation of a plurality of semiconductor wafers W, e.g., twenty five semiconductor wafers W, cleaning processing can be performed even after every film formation of one semiconductor wafer W without unacceptably lowering the throughput, as shown in FIG. 5, because operation of decreasing and increasing the temperature of the susceptor can be omitted.

In this case, cleaning processing is immediately carried out even after only a slight amount of unnecessary Ti film sticks. Therefore, a very short time is sufficient for every cleaning processing, and besides, film formation can always be carried out under a condition that no unnecessary Ti film sticks to the inner walls of the chamber or the like. Accordingly, it is possible to prevent generation of particles and to improve the yield.

Although the present embodiment has been explained with reference to a case of using a $N_2$ gas as an inactive gas, the inactive gas is limited hitherto but He, Ar, Ne, or the like may be used.

Also, the above explanation has been made with reference to an example in which semiconductor wafers W are used as objects to be processed. Needless to say, however, objects to be processed are not limited hitherto but the present invention is applicable to glass substrates, LCD substrates, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A cleaning processing method for a film forming apparatus for forming a film containing at least Ti on a surface of an object to be processed, the method comprising using a gas consisting essentially of $TiCl_4$ as a cleaning gas for removing a unnecessary portion of the Ti film sticking to a process chamber in the film forming apparatus.

2. A method according to claim 1, further comprising feeding an inactive gas into the process chamber together with the $TiCl_4$ gas.

3. A cleaning processing method for a film forming apparatus, the method comprising mounting an object to be processed on a susceptor in a process chamber of the film forming apparatus;

forming a film of Ti on a surface of the object in a region of a plasma generated in an atmosphere including a $TiCl_4$ gas a $H_2$ gas, and an Ar gas;

conveying the object out of the process chamber;

then removing the $H_2$ gas and the Ar gas from the atmosphere; and cleaning using the $TiCl_4$ gas, without generating a plasma, to remove an unnecessary portion of the Ti film sticking to the film forming apparatus.

4. A method according to claim 3, wherein a temperature in the film forming apparatus when forming the Ti film on the object is maintained from about 500° C. to about 700° C.

5. A method according to claim 3, wherein a film forming temperature in the film forming apparatus when forming the Ti film on the object is set in a range of from about 500° C. to about 700° C., and a temperature in the film forming apparatus during the cleaning using the $TiCl_4$ gas is substantially equal to the film forming temperature.

6. A method according to claim 3, wherein the cleaning using the $TiCl_4$ gas is carried out after the forming of the Ti film is sequentially performed on a plurality of objects to be processed.

7. A method according to claim 3, wherein the cleaning using the $TiCl_4$ gas is carried out after the forming of the Ti film is performed on one object to be processed.

8. A method according to claim 3, wherein the cleaning using the $TiCl_4$ gas comprises introducing the $TiCl_4$ gas together with an inactive gas into the process chamber.

9. A method according to claim 3, wherein a temperature in the film forming apparatus when forming the Ti film on the object is maintained at about 650° C.

10. A cleaning method for a film forming apparatus, the method comprising
   a) placing an object to be processed in a process chamber;
   b) introducing a film forming material gas into the process chamber to form a film containing Ti on a surface of the object, the material gas including at least a $TiCl_4$ gas and a reducing gas;
   c) then conveying the object from the process chamber; and
   d) introducing a cleaning gas consisting essentially of the $TiCl_4$ gas but no reducing gas, into the process chamber to remove an unnecessary portion of the Ti film sticking to the process chamber.

11. A cleaning method according to claim 10, wherein d) is performed after a) through c) are performed for a plurality of times.

12. A cleaning method according to claim 10, wherein b) is performed while applying a high frequency energy, and d) is performed without applying high frequency energy.

13. A cleaning method according to claim 10, wherein b) and d) are performed within a range of temperature from about 500° C. to about 700° C.

14. A cleaning method according to claim 13, wherein b) and d) are performed at a substantially equal temperature.

* * * * *